(12) United States Patent
Lee et al.

(10) Patent No.: US 6,863,592 B2
(45) Date of Patent: Mar. 8, 2005

(54) CHEMICAL/MECHANICAL POLISHING SLURRY AND CHEMICAL MECHANICAL POLISHING METHOD USING THE SAME

(75) Inventors: Jong-won Lee, Sungnam (KR); Chang-ki Hong, Seoul (KR); Jae-dong Lee, Suwon (KR)

(73) Assignee: Samsung Electronics Co., Ltd. (KR)

( * ) Notice: Subject to any disclaimer, the term of this patent is extended or adjusted under 35 U.S.C. 154(b) by 102 days.

(21) Appl. No.: 10/291,357

(22) Filed: Nov. 8, 2002

(65) Prior Publication Data

US 2004/0033764 A1 Feb. 19, 2004

(30) Foreign Application Priority Data

Aug. 16, 2002 (KR) ........................................ 2002-48403

(51) Int. Cl.[7] ................................................ B24B 1/00
(52) U.S. Cl. .............................. 451/36; 51/298; 51/309
(58) Field of Search ........................... 51/298, 306, 309; 216/88, 89; 252/6, 540, 935; 438/690, 692, 693; 451/36, 41, 59, 63

(56) References Cited

U.S. PATENT DOCUMENTS

| | | | | |
|---|---|---|---|---|
| 5,759,917 | A | | 6/1998 | Grover et al. ............... 438/690 |
| 6,383,934 | B1 | * | 5/2002 | Sabde et al. ................. 438/692 |
| 6,540,935 | B2 | * | 4/2003 | Lee et al. .................... 252/79.1 |
| 6,733,553 | B2 | * | 5/2004 | Kido et al. .................... 51/307 |
| 2002/0098696 | A1 | * | 7/2002 | Sabde et al. ................. 438/689 |

FOREIGN PATENT DOCUMENTS

| | | | | |
|---|---|---|---|---|
| EP | 1148 538 A1 | 10/2001 | ......... H01L/21/304 |
| WO | WO 99/64527 | 12/1999 | ............ C09G/1/02 |

\* cited by examiner

*Primary Examiner*—Timothy V. Eley
(74) *Attorney, Agent, or Firm*—F. Chau & Associates, LLC; Frank V. DeRosa, Esq.

(57) ABSTRACT

CMP (chemical/mechanical polishing) slurries that can rapidly remove a target layer and can effectively passivate a polishing stopper, with high selectivity. In one aspect, a CMP slurry comprises metal oxide abrasive particles, a removal rate accelerator, an anionic polymeric passivation agent having a molecular weight in a range of about 1,000 to about 100,000, a C1–C12 anionic passivation agent, and water.

39 Claims, 8 Drawing Sheets

(AHP+PMA)

(AHP+PHP)

CHEMICAL/MECHANICAL POLISHING SLURRY AND CHEMICAL MECHANICAL POLISHING METHOD USING THE SAME

CROSS-REFERENCE TO RELATED APPLICATION

This application claims priority to Korean Patent Application No. 2002-48403 filed on Aug. 16, 2002, which is fully incorporated herein by reference.

TECHNICAL FIELD OF THE INVENTION

The present invention generally relates to CMP (chemical/mechanical polishing) slurries for use in the manufacture of microelectronic devices. More particularly, the present invention relates to CMP slurries that can rapidly remove a target layer and effectively passivate a polishing stopper, with high selectivity.

BACKGROUND

Semiconductor devices have become increasingly more integrated and smaller with multilayered interconnections and consequently, the amount of processing steps have increased to form multiple conductive layers or insulating layers on a wafer. To eliminate steps in semiconductor device fabrication, CMP, which is a combination of chemical and mechanical processes, is commonly used. CMP was developed in the late 1980s by International Business Machines Corporation. Since its introduction, CMP has been applied as a core micro-processing technique at almost all stages of fabrication of 64 Mbit or greater memory and non-memory devices. Currently, CMP is receiving great consideration for use in the fabrication of next generation gigabit level DRAM memories or equivalent level non-memory devices.

CMP is a type of planarization process. In CMP, a wafer surface having irregularities is pressed against a polishing pad in relative rotation, while an abrasive slurry is made to flow to a contact area of the wafer and polishing pad. CMP planarizes the irregular wafer surface by means of chemical and physical reactions. The performance of CMP is determined by factors such as the operating conditions of a CMP apparatus, the type of slurry, and the type of polishing pad.

Among such factors, the type of slurry that is used for CMP is the most critical factor affecting polishing performance. However, with conventional CMP slurries, which are used in the formation of shallow trench isolation (STI) or the formation of an interlayer dielectric (ILD) layer, wherein a self-aligned contact hole exposing a source/drain region of a DRAM is formed, the selectivity of a target layer to be polished (e.g., an oxide layer) with respect to a polishing stopper (e.g., a silicon nitride layer) is at a ratio of 4:1, which is considered poor selectivity. As a result, the polishing stopper is excessively polished. To combat excessive polishing of the stopper, the thickness of the polishing stopper must be increased. Further, with conventional slurries, the polishing stopper remaining after the CMP has thickness variations, which results in an uneven wafer surface and reduces a margin for subsequent device manufacturing processes. As a result, the characteristics of the semiconductor device can degrade. Accordingly, there is a need for a new, high selectivity CMP slurry.

SUMMARY OF THE INVENTION

The present invention is directed to methods for making CMP slurries with high selectivity. A CMP slurry according to the present invention provides rapid removal of a target layer and effective passivation of a polishing stopper, with high selectivity. A CMP slurry according to the invention can provide a selectivity of the target layer to the polishing stopper in a range of about 30:1 to about 50:1.

In one aspect of the invention, a slurry comprises metal oxide abrasive particles, a removal rate accelerator, an anionic polymeric passivation agent having a molecular weight in a range of about 1,000 to about 100,000, a C1–C12 anionic passivation agent, and water.

Preferably, the metal oxide abrasive particles comprise ceria, silica, alumina, titania, zirconia, or germania, or any combination of the forgoing materials. Preferably, the removal rate accelerator comprises a phosphate compound or a phosphite compound. Preferably, the anionic polymeric passivation agent comprises poly(acrylic acid), poly (methacrylic acid), poly(acrylic acid-maleic acid), poly (methacrylic acid-maleic acid), poly(acrylic acid-acrylamide), poly(acrylonitrile-butadien-acrylic acid), or poly(acrylonitrile-butadien-methacrylic acid), or a derivative or salt of the forgoing materials, or any combination of the forgoing materials.

A slurry according to the invention may further comprise a pH controller. The slurry preferably has a PH in a range of about 3 to about 6.

In another aspect, a CMP slurry according to the invention is used in a chemical/mechanical polishing process. For instance, the slurry may be used for chemical/mechanical polishing a wafer on which a polishing stopper and a target layer to be polished are deposited. The target layer to be polished may be an oxide layer, and the polishing stopper may be a silicon nitride layer. A CMP process comprises loading the wafer into a CMP apparatus and performing CMP on a target layer on a surface of the wafer while supplying a CMP slurry according to the invention between the surface of the target layer on the wafer and a polishing pad.

These and other aspects, objects, features and advantages of the present invention will become apparent from the following detailed description of preferred embodiments thereof, which is to be read in connection with the accompanying drawings.

DETAILED DESCRIPTION OF THE PREFERRED EMBODIMENTS

Figure 1:
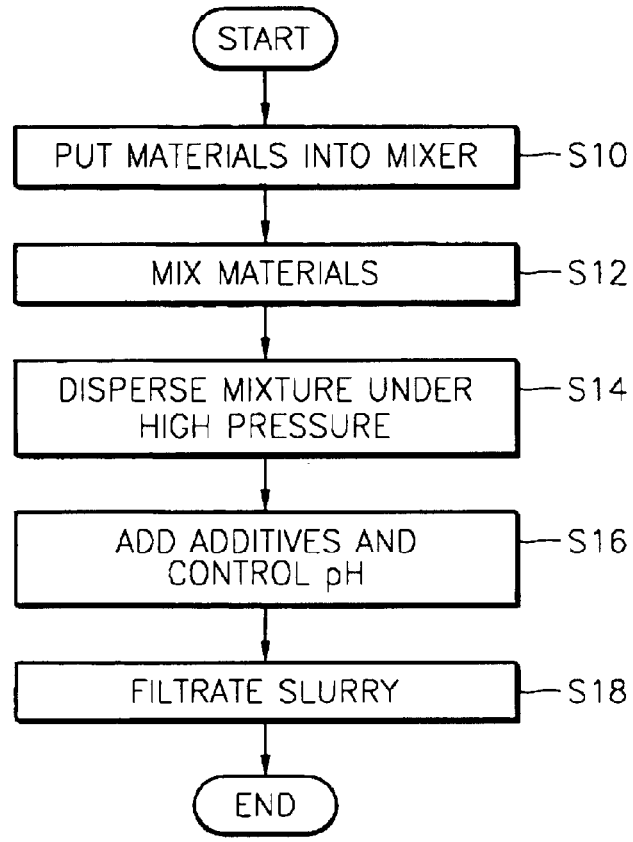
FIG. 1 is a flowchart illustrating a method for preparing a chemical/mechanical polishing (CMP) slurry according to the present invention.

Chemical/mechanical polishing (CMP) slurries according to various embodiments of the invention, and CMP methods using such slurries, will now be described more fully with reference to the accompanying drawings. It is to be understood that the invention may be embodied in many different forms and that the embodiments described herein should not be construed as placing any limitation on the scope of the invention. Indeed, exemplary embodiments are provided so that this disclosure will be thorough and complete, and will fully convey the concept of the invention to those having ordinary skill in the art. It is to be further understood that in the drawings, the thickness of layers and regions are simplified or exaggerated for clarity and that like reference numerals are used to refer to the same or similar elements throughout the various views.

In general, a high-selectivity CMP slurry according to the present invention preferably comprises a mixture of abrasive particles and first, second and third additives to provide slurry characteristic adjustments. More specifically, a CMP slurry according to the present invention comprises a metal oxide as the abrasive particles. Suitable metal oxides comprise ceria, silica, alumina, titania, zirconia, germania, or similar materials, or mixtures of the forgoing materials. Preferably, the metal oxide abrasive particles are mixed with deionized water to a concentration of about 0.5% to about 25% by weight (hereinafter, wt %) based on the total weight of the slurry. If the amount of the metal oxide abrasive particles is less than 0.5 wt %, the polishing rate becomes too low. If the amount of the metal oxide abrasive particles is greater than 25 wt %, stability in the slurry dispersion is not ensured. For these reasons, the above concentration range is preferred for the abrasive particles.

A removal rate accelerator is preferably used as a first additive. Preferably, a removal rate accelerator comprises a material that is capable of increasing the rate at which a target layer to be polished is removed. Suitable removal rate accelerators include, for example, phosphate compounds or phosphite compounds. Preferred phosphate compounds include, for example, ammonium hydrogen phosphate, ammonium dihydrogen phosphate, potassium dihydrogen phosphate, bis(2-ethylhexyl)phosphate, 2-aminoethyl dihydrogen phosphate, 4-chlorobenzene diazonium hexafluorophosphate, nitrobenzene diazonium hexafluorophosphate, ammonium hexafluorophosphate, bis (2,4dichlorophenyl)chlorophosphate, bis(2-ethylhexyl) hydrogenphosphate, calcium fluorophosphates, diethyl chlorophosphate, diethyl chlorothiophosphate, potassium hexafluorophosphate, pyrophosphate, tetrabutylammonium hexafluorophosphate, tetraethylammonium hexafluorophosphate, or any combination of the forgoing materials. A preferred phosphite compound includes bis(2-ethylhexyl)phosphite, for example.

In one embodiment, the removal rate accelerator is preferably added in a concentration in the range of about 0.001 wt % to about 10 wt % based on the total weight of the slurry. If the amount of the removal rate accelerator is less than 0.001 wt %, the polishing rate becomes too low. If the amount of the removal rate accelerator is greater than 10 wt %, stability in the slurry dispersion becomes poor, and the polishing rate is uncontrollable. For these reasons, the above concentration range is preferred for the removal rate accelerator. In another embodiment, the removal rate accelerator is preferably added in an amount in a range of about 0.01 wt % to about 1 wt %.

For a second additive, a passivation agent for the polishing stopper is preferably used, which is also capable of enhancing dispersion stability of the abrasive particles and adjusting fluidity of the slurry. When the polishing stopper is a silicon nitride layer and the target layer is an oxide layer, it is preferable to use an anionic polymeric passivation agent as a second additive. The anionic polymeric passivation agent preferably has a molecular weight of about 1,000 to about 100,000 in terms of slurry fluidity. Suitable anionic polymeric passivation agents include, for example, monopolymers (e.g., poly(acrylic acid) and poly(methacrylic acid)), copolymers (e.g., poly(acrylic acid-maleic acid), poly (methacrylic acid-maleic acid), and poly(acrylic acid-acrylamide)), terpolymers (e.g., poly(acrylonitrile-butadien-acrylic acid), poly(acrylonitrile-butadien-methacrylic acid)), derivatives or salts of the forgoing materials, or any combination of the forgoing materials.

In one embodiment, the anionic polymeric passivation agent is preferably added in an amount in a range of about 0.001 wt % to about 10 wt % based on the total weight of the slurry. If the amount of the anionic polymeric passivation agent is less than about 0.001 wt %, the passivation is not effective. If the amount of the anionic polymeric passivation agent is greater than about 10 wt %, the polishing rate becomes too low. In another embodiment, the anionic polymeric passivation agent is added in an amount in a range of about 0.01 wt % to about 1 wt % based on the total weight of the slurry.

A passivation agent is preferably used as a third additive for enhancing the passivation effect on the polishing stopper. When the polishing stopper is a silicon nitride layer, preferably, a C1–C12 anionic passivation agent is preferably used. Suitable C1–C12 anionic passivation agents include, for example, phthalate compounds such as calcium hydrogen phthalate.

In one embodiment, a C1–C12 anionic passivation agent is preferably added in an amount in a range of about 0.001 wt % to about 10 wt % based on the total weight of the slurry. If the amount of the C1–C12 anionic passivation agent is less than about 0.001 wt %, high polishing selectivity is not ensured. If the amount of the C1–C12 anionic passivation agent is greater than about 10 wt %, the polishing rate becomes too low. For these reasons, the above concentration range is preferred for the removal rate accelerator. In another embodiment, the passivation agent (third additive) is preferably added in an amount in a range of about 0.01 wt % to about 1 wt % based on the total weight of the slurry.

A CMP slurry according to another embodiment of the invention further comprises a pH controller to provide an optimal pH of the slurry. The pH of the slurry varies depending on the constituents of the target layer and polishing stopper. When the target layer to be polished is an oxide layer and the polishing stopper is a silicon nitride layer, it is preferable to adjust the pH of the slurry in the range of about 3 to about 6.

A suitable pH controller includes a base such as potassium hydroxide (KOH), ammonium hydroxide (NH4OH), sodium hydroxide (NaOH), tetramethylammonium hydroxide (TMAH), or choline, for example. Alternatively, a suitable pH controller includes an acid such as sulfuric acid ($H_2SO_4$), hydrochloric acid (HCl), phosphoric acid ($H_3PO_4$), nitric acid ($HNO_4$), or acetic acid ($CH_3COOH$), for example.

Advantageously, in an aqueous CMP slurry according to the present invention, due to interactions of the first, second and third additives, the rate of removing the target layer is increased, and the polishing stopper is more effectively passivated, thereby resulting in high polishing selectivity. For instance, by using a removal rate accelerator as a first additive, a removal rate of the target layer (for example, an oxide layer) to be polished can be adjusted in a range of about 2000 to about 6000 Å/min.

Next, by using an anionic polymeric passivation agent (preferably having a molecular weight in a range of about 1,000 to about 100,000) as a second additive, the anionic polymer dissolved in an aqueous CMP slurry acts as a passivation agent and also restricts mobility of the abrasive particles in a bulk phase to affect fluidity of the slurry.

Figure 15:
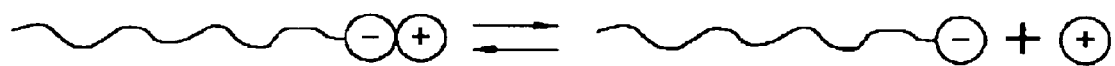
FIG. 15 is an exemplary diagram of a reaction scheme illustrating a process of dissolving an anionic polymeric passivation agent to produce anionic polymers.

An anionic polymeric passivation agent that is dissolved in an aqueous slurry produces a large quantity of anionic polymers, as illustrated in the reaction scheme depicted in FIG. 15. Anionic polymers are strongly adsorbed onto a positively charged surface by an electrostatic attractive force. In contrast, anionic polymers are repelled by a negatively charged surface due to an electrostatic repulsive force. Accordingly, the anionic polymer in the CMP slurry is adsorbed onto a positively charged surface for passivation. As a result, a negatively charged region of the wafer can be selectively polished while the positively charge region is protected from being polished. As noted above, the anionic polymer dissolved in the aqueous CMP slurry acts as a passivation agent and also restricts mobility of the abrasive particles in a bulk phase to affect fluidity of the slurry. Where a wafer has different steps on its surface, a large step region of the wafer can be removed quickly, while a small step region can be removed slowly by the anionic polymeric passivation agent.

A C1–C12 anionic passivation agent preferably used as a third additive to enhance the passivation effect of the above-described anionic polymeric passivation agent. Indeed, a C1–C12 anionic passivation agent is preferably dissolved in the aqueous slurry and is negatively charged, for example, as $C_8H_4O_4^{2-}$ when potassium hydrogen phthalate is used.

To increase the polishing selectivity using the function of the passivation agents, the oxide target layer to be polished should be negatively charged in the aqueous slurry and the nitride polishing stopper should be positively charged in the aqueous slurry. A film surface is positively charged in the aqueous slurry when the pH of the slurry is lower than an isoelectric point and is negatively charged when the pH of the slurry is greater than the isoelectric point. Accordingly, by controlling the pH of the slurry, it is possible to charge two different films with opposite polarities. Therefore, in one embodiment of the invention, the pH of the slurry is preferably adjusted to an optimal level using a pH controller.

To increase a processing margin and reduce occurrences of a dishing phenomenon, it is preferable to adjust a CMP slurry according to the present invention such that a selectivity of the target layer to the polishing stopper is in the range of about 30:1 to about 50:1.

Hereinafter, a method for preparing a high selectivity CMP slurry according to an embodiment of the present invention will be described with reference to FIG. 1.

Initially, abrasive particles are placed into a high shear mixer containing deionized water (step S10). The deionized water and the abrasive particles, are preliminarily mixed (step S12). In the preliminary mixing (step S12), an amount of the abrasive particles is adjusted to be in a range of about 0.5 wt % to about 0.25 wt % based on the total weight of the final slurry, and a pH of the slurry is adjusted to be in either a weak acid range or a weak alkali range.

The slurry mixture is transferred into an appropriate dispersion apparatus (e.g., media mill or ultra high pressure dispersion apparatus) using a pump and then thoroughly dispersed under a high pressure (step S14). Any dispersion apparatus can be used. However, considering a variety of factors, such as reproducibility in dispersion formation, reduction in contamination during dispersion, and average particle size and dispersibility after dispersion, the use of an ultra high pressure dispersion apparatus is preferred. In this case, in consideration of durability, it is preferable that an ultra hard dispersion chamber, which is a core part of a ultra high pressure dispersion apparatus, is formed of diamond. During the high pressure dispersion process, an appropriate pressure in the range of about 10,000 psi to about 20,000 psi is applied. If the pressure is lower than this range, the dispersion efficiency becomes too low. If the pressure is greater than this range, it adversely affects the system efficiency and chamber durability.

After controlling the average slurry particle size via the ultra high pressure dispersion, deionized water can be further added to appropriately control the concentration of the abrasive particles in the slurry.

Next, first, second and third additives are added to achieve a desired characteristic of the slurry (step S16). In particular, a removal rate accelerator, which facilitates the removal of the target layer to be polished, is added in an amount in a range of about 0.001 wt % to about 10 wt %. An anionic polyrneric passivation agent and a C1–C12 anionic passivation agent are added, each in an amount in the range of about 0.01 wt % to about 10 wt %.

When an optimal pH of the slurry is not achieved with the additions of the first, second and third additives, optionally, a pH controller can be added to obtain an optimal pH.

The amounts of the additives and/or the amount of the pH controller, which are added in the preparation of a CMP slurry according to the present invention, are preferably determined by the interaction therebetween in the aqueous CMP slurry and are optimized for the best polishing effect.

After the additives are mixed and the pH of the slurry is adjusted, the slurry is passed through a filter to rapidly remove relatively large particles (step S18). This filtration process reduces occurrences of scratches on the surface of the target layer during polishing. After the slurry filtration process, the slurry is analyzed to determine general physical characteristics and performance.

Hereinafter, CMP methods according to various embodiments of the present invention will be described, for example, with reference to FIGS. 2 and 3.

Figure 2:
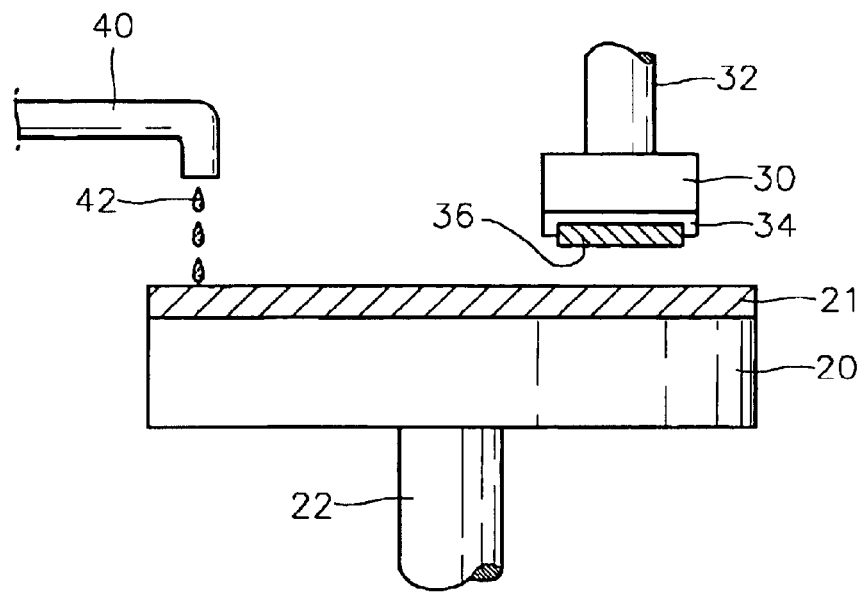
FIG. 2 is a schematic view of a CMP apparatus that may be used to perform a CMP method using a CMP slurry according to the present invention.

Referring to FIG. 2, in a CMP apparatus, a polishing platen 20 with a polishing pad 21 thereon is made to rotate in connection with and around a first rotary shaft 22 that is rotated by a motor (not shown). A polishing head 30 is disposed above the polishing pad 21 and is attached to a second rotary shaft 32 that is rotated by a motor (not shown). The polishing head 30 is rotated in an opposite direction of the rotation of the polishing platen 20. A wafer 36 (which is to be subject to CMP) is detachably fixed to the polishing head 30 by a clamp 34 mounted on the surface of the polishing head 30. A slurry 42 according to the invention is supplied from a slurry supply line 40 to one side of the polishing platen 20.

Figure 3:
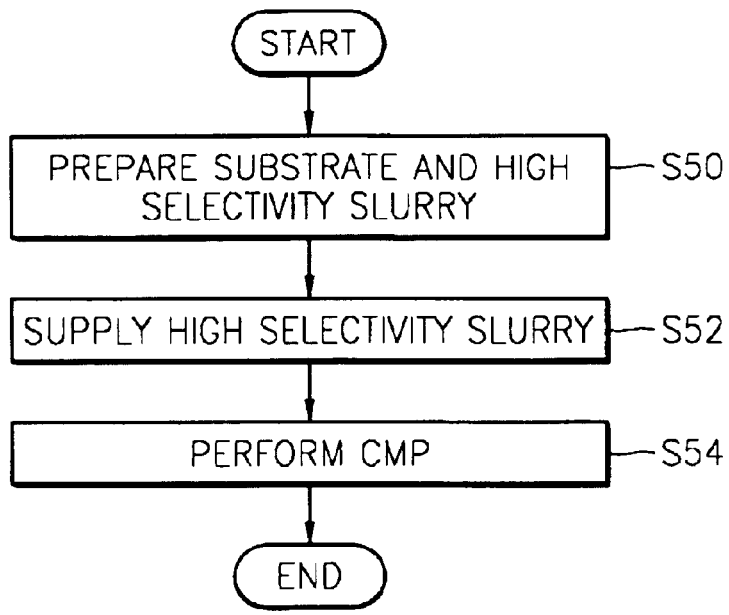
FIG. 3 is a flowchart illustrating a CMP method according to one aspect of the invention.

In a CMP process according to the invention, referring to FIGS. 2 and 3, the wafer 36 to be subjected to CMP and the CMP slurry 42 are prepared (step S50). Next, the wafer 36 is fixed to the polishing head 30, and the CMP slurry 42 is supplied onto the wafer 36 (step S52). The wafer 36 may include an oxide layer as a target layer to be polished and a silicon nitride layer as a polishing stopper. A high selectivity CMP slurry according to the present invention can be applied to a wafer on which shallow trench isolation (STI) and interlayer dielectric (ILD) film formation will be performed. In current STI and ILD film formation processes, an oxide layer, such as a high density plasma oxide layer formed by high density plasma chemical vapor deposition (HDPCVD), or a plasma enhanced tetraethylorthosilicate (PE-TEOS) layer formed by plasma enhanced chemical vapor deposition (PECVD), is a target layer to be polished, and a silicon nitride layer, which is formed by low pressure chemical vapor deposition (LPCVD) at a pressure of hundreds of mTorr or less or by PECVD at a high temperature of about 500 to about 600 degrees C., functions as a polishing stopper.

After a high selectivity slurry according to the present invention is supplied onto the wafer (step S52), a trench filling oxide layer or an ILD layer is polished (step S54).

The invention will now be described in greater detail with reference to the following experimental examples. Technical information that is common to and can be easily inferred by those of ordinary skill in the art is not fully described in the following experimental examples. The following experimental examples are for illustrative purposes and are not intended to limit the scope of the present invention.

EXPERIMENTAL EXAMPLE 1

In this experiment, based on the method described with respect to FIG. 1, various slurries were prepared by adding ammonium hydrogen phosphate (AHP) as a removal rate accelerator in different amounts to an aqueous solution containing 1 wt % ceria (metal oxide abrasive particles) as a first additive.

PE-TEOS blanket wafers, each having an 8000 Å—thick oxide (PE-TEOS) layer, were prepared as sample wafers.

Figure 4:
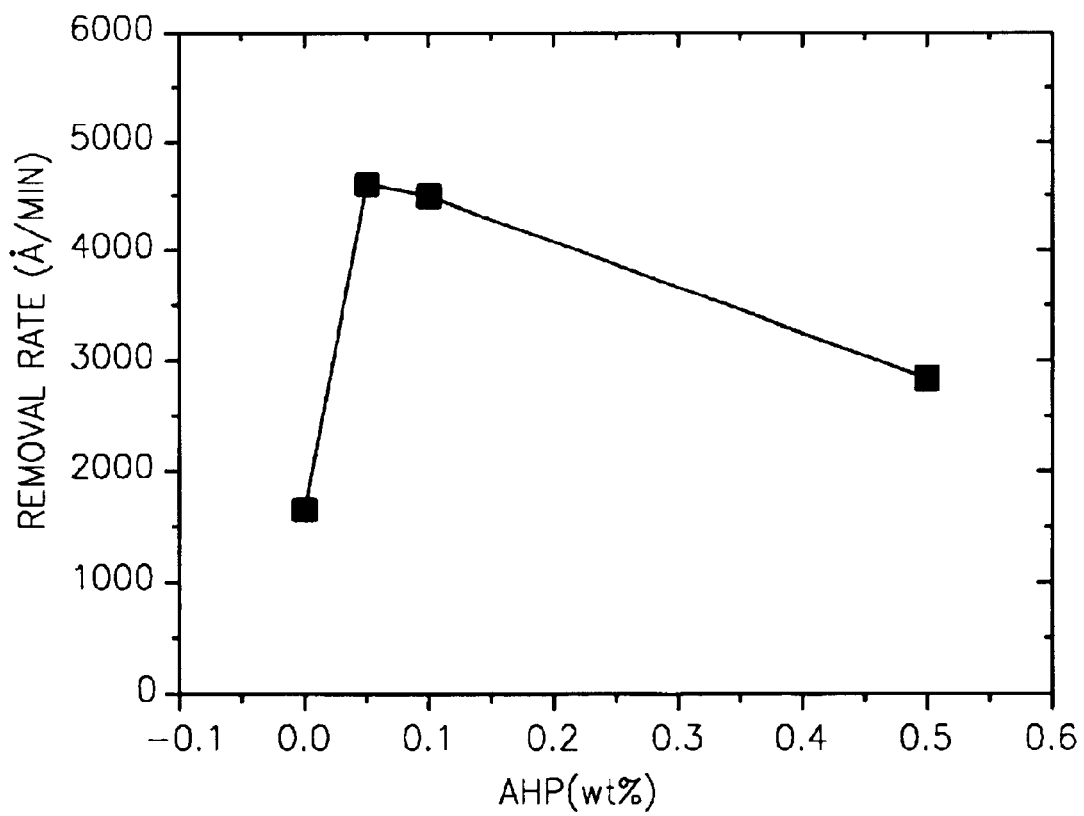
FIG. 4 is a graph illustrating a variation in oxide (PE-TEOS) removal rate as a function of an amount of ammonium hydrogen phosphate.

CMP was then performed on the sample wafers while supplying the slurries containing different amounts of AHP (as shown in Table 1) thereon, and oxide removal rates were measured. The CMP was performed using MIRRA_MESA equipment (RODEL Co., Ltd) under the following conditions: an IC1000 stack pad at a membrane force of 3.5 psi, a retaining ring force of 4.5 psi, an inner tube force of 3.5 psi, a table speed of 110 rpm, a head speed of 104 rpm, and a slurry flow rate of 3000 mL/min. The CMP results are shown in Table 1. FIG. 4 is a graphical illustration of the results.

TABLE 1

| AHP, wt % | Oxide (PE-TEOS) removal rate, Å/min | pH |
|---|---|---|
| 0 | 1655 | 5 |
| 0.05 | 4602 | 5 |
| 0.1 | 4499 | 5 |
| 0.5 | 2875 | 5 |

As can be gleaned from Table 1 and FIG. 4, the oxide removal rate increased when AHP was added, compared to the case where no AHP was added. However, the oxide removal rate decreased when the amount of AHP added was further increased. This result is believed to be due to excess phosphate groups being dissolved in the slurry and adsorbed on the abrasive particles to hinder CMP, as can be inferred from the fact that the abrasive particles were precipitated when AHP was added in excess. In consideration of an appropriate oxide removal rate and prevention of the abrasive particle precipitation, a preferred amount of AHP added was determined to be about 10 wt % or less, and preferably, about 1 wt %.

EXPERIMENTAL EXAMPLE 2

In this experiment, various slurries were prepared by adding 0.25 wt % AHP and different amounts of poly (methacrylic acid) (PMA) as an anionic polymeric passivation agent to an aqueous solution of 1 wt % ceria.

PE-TEOS and silicon nitride (Si3N4) blanket wafers, wherein an oxide (PE-TEOS) layer and a silicon nitride layer were deposited to thicknesses of 8000 Å and 2000 Å, respectively, were prepared as sample wafers.

Figure 5:
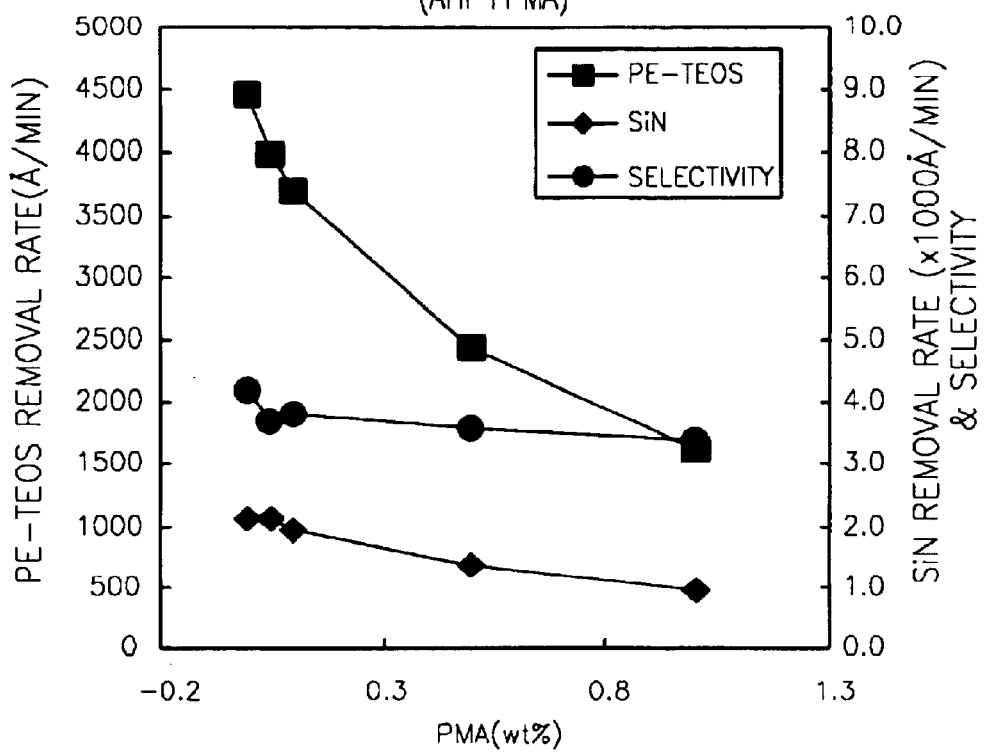
FIGS. 5, 6 and 7 are graphs illustrating variations in silicon nitride (SiN) and PE-TEOX removal rates and selectivity as a function of additive amount using different additives for various slurries according to the invention.

CMP was performed on the sample wafers while supplying the slurries prepared with the compositions of Table 2, using the same CMP apparatus and under the same operating conditions as in Experimental Example 1. Oxide and silicon nitride removal rates and selectivity were measured during the CMP. The results are shown in Table 2 below. FIG. 5 is a graphical illustration of the results.

TABLE 2

| | | | Removal rate, Å/min | | |
|---|---|---|---|---|---|
| AHP, wt % | PMA, wt % | pH | Oxide (PE-TEOS) | Silicon nitride (Si3N4) | Selectivity |
| 0.25 | 0.05 | 5 | 3993 | 1078 | 3.7:1 |
| 0.25 | 0.1 | 5 | 3706 | 975 | 3.8:1 |
| 0.25 | 0.5 | 5 | 2448 | 679 | 3.6:1 |
| 0.25 | 1 | 5 | 1617 | 478 | 3.4:1 |

As can be gleaned from Table 2 and FIG. 5, when the amount of PMA used as the anionic polymeric passivation agent was increased, the silicon nitride removal rate decreased. The effect of the anionic polymeric passivation agent is evident. However, as shown, increasing the amount of the anionic polymeric passivation agent linearly reduces the oxide removal rate. In all sample wafers where only PMA was used as a passivation agent, the selectivity was relatively low.

EXPERIMENTAL EXAMPLE 3

In this experiment, various slurries were prepared by adding 0.2 wt % AHP and different amounts of potassium hydrogen phthalate (PHP) as a C1–C12 anionic passivation agent to an aqueous solution of 1 wt % ceria.

Figure 6:
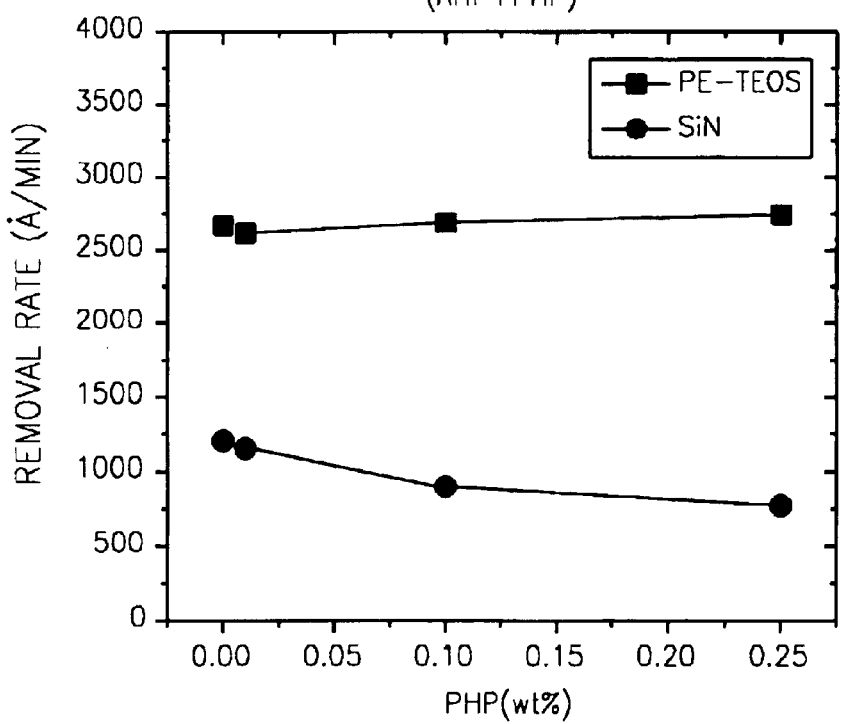

The same sample wafers as in Experimental Example 2 were prepared, and CMP was performed in the same CMP apparatus and under the same operating conditions as in Experimental Example 2. Oxide and silicon nitride removal rates and selectivity were measured during the CMP. The results are shown in Table 3 below. FIG. 6 is a graphical illustration of the results.

TABLE 3

| AHP, wt % | PHP, wt % | pH | Oxide (PE-TEOS) | Silicon nitride (Si3N4) | Selectivity |
|---|---|---|---|---|---|
| 0 | 0 | 5 | 1242 | 542 | 2.3:1 |
| 0.2 | 0 | 5 | 2668 | 1206 | 2.2:1 |
| 0.2 | 0.01 | 5 | 2615 | 1155 | 2.3:1 |
| 0.2 | 0.1 | 5 | 2668 | 899 | 3.0:1 |
| 0.2 | 0.25 | 5 | 2744 | 772 | 3.6:1 |

Removal rate, Å/min

As can be gleaned from Table 3 and FIG. 6, as the amount of PHP used as the C1–C12 anionic passivation agent increases, the silicon nitride removal rate decreases. The passivation effect of the anionic passivation agent is evident. Also, increasing the amount of the anionic passivation agent slightly increased the oxide removal rate, as compared to the case where no anionic passivation agent was added. Similar to Experimental Example 2, where only one kind of a passivation agent, PMA, was used, the selectivity was relatively low in all test samples where only PHP was added as the passivation agent.

EXPERIMENTAL EXAMPLE 4

In this experiment, based on the results of Experimental Examples 1, 2 and 3, various slurries were prepared by adding 0.05 wt % AHP, PMA, and PHP to an aqueous solution of 1 wt % ceria. The amount of PMA was fixed at 0.05 wt %, and the amount of PHP was varied to prepare different slurries.

Figure 7:
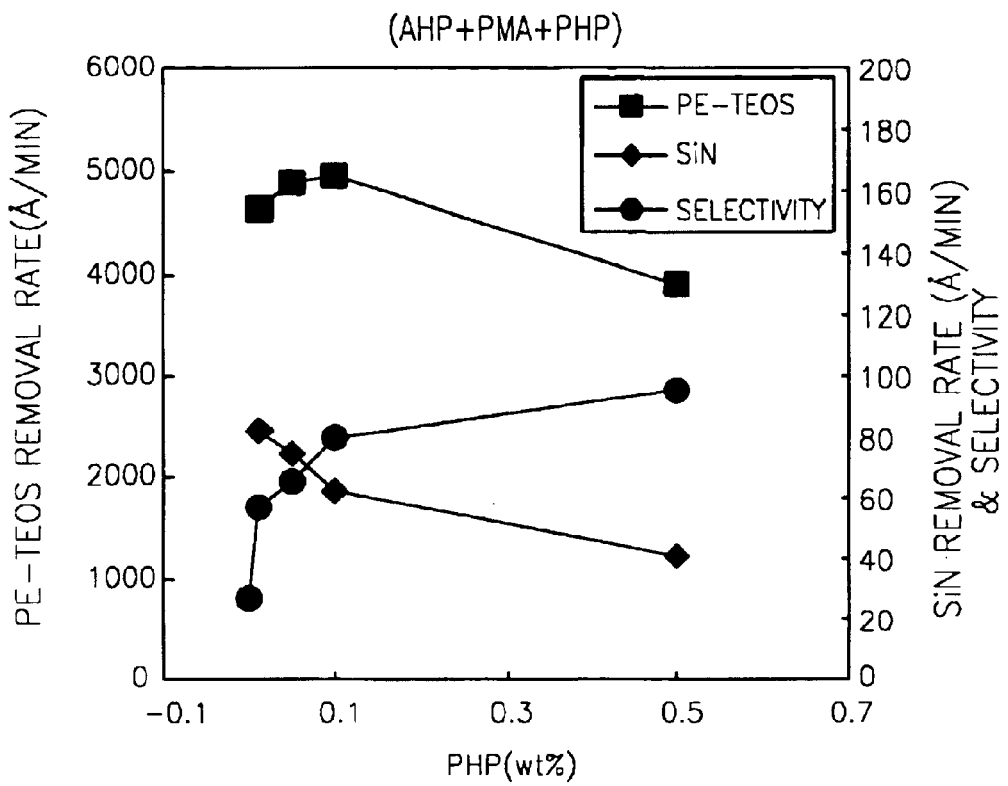

The same sample wafers as in Experimental Example 2 were prepared, and CMP was performed using the same CMP apparatus and under the same operating conditions as in Experimental Example 2. Oxide and silicon nitride removal rates and selectivity were measured during the CMP. The results are shown in Table 4 below. FIG. 7 is a graphical illustration of the results.

TABLE 4

| AHP wt % | PMA, wt % | PHP, wt % | pH | Oxide (PE-TEOS) | Silicon nitride (Si3N4) | Selectivity |
|---|---|---|---|---|---|---|
| 0.05 | 0.05 | 0.01 | 5 | 4641 | 82 | 57:1 |
| 0.05 | 0.05 | 0.05 | 5 | 4890 | 75 | 65:1 |
| 0.05 | 0.05 | 0.1 | 5 | 4960 | 62 | 80:1 |
| 0.05 | 0.05 | 0.5 | 5 | 3902 | 41 | 95:1 |

Removal rate, Å/min

As can be gleaned from Table 4 and FIG. 7, when two kinds of anionic passivation agents, PMA and PHP, were used together, high oxide to silicon nitride selectivity was achieved.

EXPERIMENTAL EXAMPLE 5

In this experiment, various slurries with different pH levels were prepared by adding 0.05 wt % AHP, 0.05 wt % PMA, and 0.05 wt % PHP to an aqueous solution of 1 wt % ceria, followed by a pH-adjustment with a 1M-H2SO4 solution and potassium hydroxide standard solution.

Figure 8:
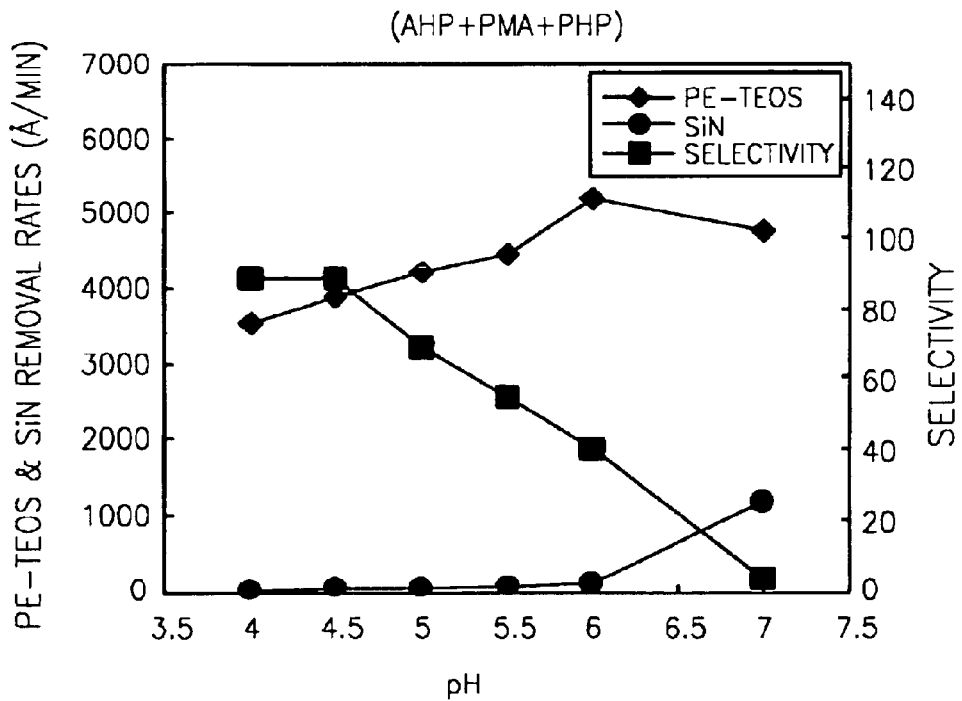
FIG. 8 is a graph illustrating variations in SiN and PE-TEOS removal rates and selectivity as a function of slurry pH.

The same sample wafers as in Experimental Example 2 were prepared, and CMP was performed using the same CMP apparatus and under the same operating conditions as in Experimental Example 2. Oxide and silicon nitride removal rates and selectivity were measured during the CMP. The results are shown in Table 5 below. FIG. 8 is a graphical illustration of the results.

TABLE 5

| pH | Oxide (PE-TEOS) | Silicon nitride (Si3N4) | Selectivity |
|---|---|---|---|
| 4 | 3544 | 40 | 89:1 |
| 4.5 | 3904 | 44 | 89:1 |
| 5 | 4214 | 61 | 69:1 |
| 5.5 | 4458 | 82 | 54:1 |
| 6 | 5190 | 129 | 40:1 |
| 7 | 4750 | 1197 | 4:1 |

Removal rate, Å/min

As can be gleaned from Table 5 and FIG. 8, as the pH of the slurry increases, the rate of removal of the oxide (PE-TEOS) and of the silicon nitride increases, and the removal rate of silicon nitride significantly increases as the pH reaches and exceeds about 6.

Furthermore, at a pH of about 6 or more, the selectivity abruptly decreases. Evidently, a CMP slurry having a pH of 6 or less is effective in increasing the oxide to silicon nitride selectivity. The reduction in this selectivity at a higher pH is due to less passivation agents being adsorbed on the silicon nitride layer. Basically, this is because the degree of dissociation of passivation agents and surface charges of the silicon nitride layer vary with pH.

With regard to the degree of dissociation, the functional —COOH group of PHP and PMA has a dissociation constant of about 4.2, so it is completely dissociated at a pH of 5 or less. However, as a pH value reaches a neutral or alkali pH, the degree of dissociation decreases. Accordingly, less negative charges that are involved in passivation are produced from the passivation agents to reduce the selectivity.

Figure 9:
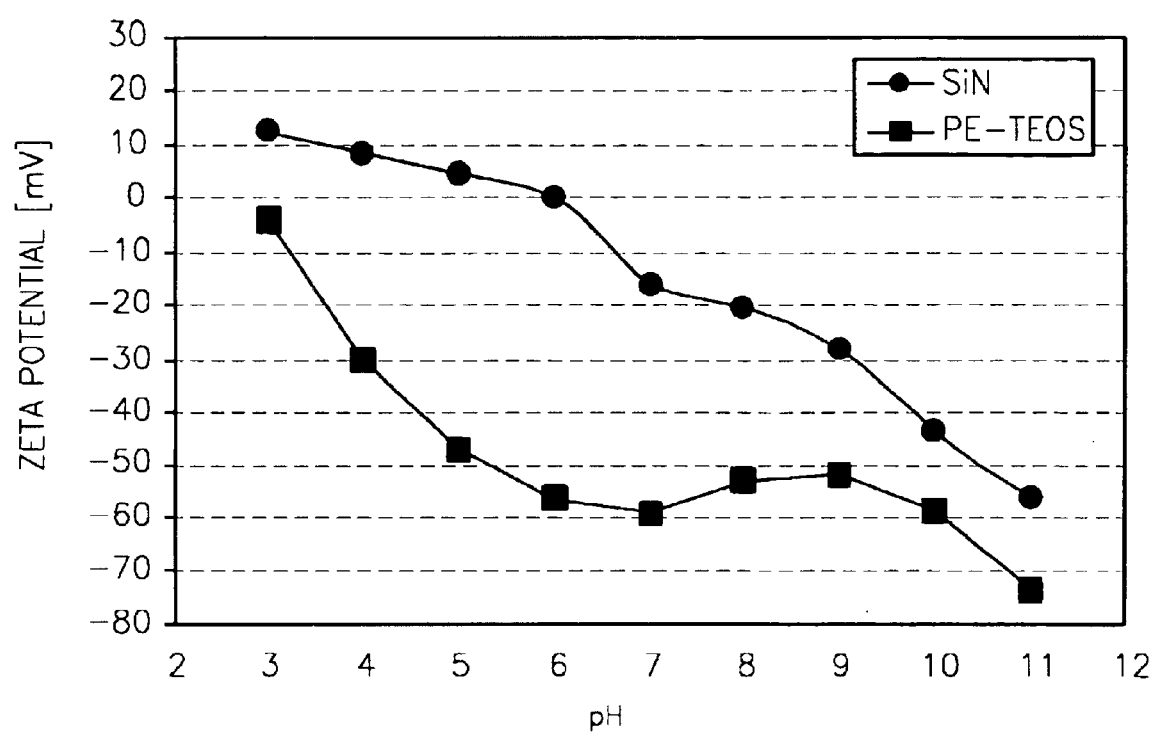
FIG. 9 is a graph illustrating a zeta potential of SiN and PE-TEOS as a function of slurry pH.

A reduction in selectivity can be explained as follows in view of surface charges of silicon nitride. The inherent surface charge of a layer can be expressed as a zeta (ζ) potential in mV. The pH of a solution at which the sign of the zeta potential in a layer changes is called the isoelectric point. As shown in FIG. 9, the isoelectric point of a HDPCVD or PECVD oxide layer is about pH 3, and that of a LPCVD or high-temperature PECVD silicon nitride layer is about pH 6. When the pH of a slurry is lower than the isoelectric point of a layer, the surface of the layer is positively charged in the slurry. When the pH of a slurry is greater than the isoelectric point of a layer, the surface of the layer is negatively charged in the slurry. Accordingly, when the pH of a slurry ranges from about 3 to about 6, the surface of the silicon nitride layer is positively charged, and the surface of the oxide layer is negatively charged. Therefore, as the anionic polymeric passivation agent and the C1–C20 anionic passivation agent are dissociated and negatively charged, the passivation agents are adsorbed onto the surface of the silicon nitride layer and effectively passivate the same.

EXPERIMENTAL EXAMPLE 6

In this experiment, various slurries were prepared by adding 0.05 wt % AHP, 0.05 wt % PHP, and an anionic polymeric passivation agent to an aqueous solution of 1 wt % ceria. Anionic polymeric passivation agents having different molecular weights were used to prepare different slurries.

The same sample wafers as in Experimental Example 2 were prepared, and CMP was performed using the same CMP apparatus and under the same operating conditions as in Experimental Example 2. Oxide and silicon nitride removal rates and selectivity were measured during the CMP. The results are shown in Table 6 below.

TABLE 6

| | Removal rate, Å/min | | |
|---|---|---|---|
| Additive | Oxide (PE-TEOS) | Silicon nitride (Si3N4) | Selectivity |
| AHP + PHP + PAA (Mw; 1,200) | 5567 | 140 | 40:1 |
| AHP + PHP + PAA (Mw; 5,000) | 6414 | 139 | 46:1 |
| AHP + PHP + PAA (Mw; 8,000) | 5179 | 123 | 42:1 |
| AHP + PHP + PAA-co-MA (Mw; 3,000) | 4241 | 94 | 45:1 |
| AHP + PHP + PAA-co-MA (Mw; 50,000) | 3982 | 117 | 34:1 |

In Table 6, "PAA" is the abbreviation for poly(acrylic acid), "PAA-co-MA" is the abbreviation for poly(acrylic acid-maleic acid), and "Mw" indicates a molecular weight. As can be gleaned from Table 6, as the molecular weight of the anionic polymeric passivation agent increases, oxide to silicon nitride selectivity decreases. A preferred range of the selectivity in terms of a processing margin is from about 30:1 to about 50:1. Accordingly, it is preferable to use an anionic polymeric passivation agent having a molecular weight of about 1,000 to about 100,000.

EXPERIMENTAL EXAMPLE 7

Figure 10:
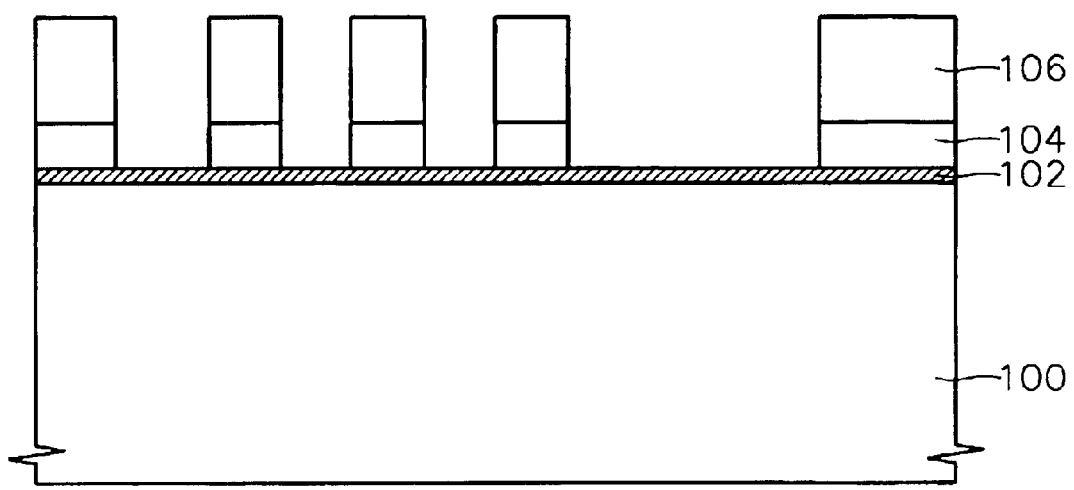
FIGS. 10, 11 and 12 are sectional views illustrating a method for preparing a sample wafer to be polished with a CMP slurry according to the present invention.
Figure 11:
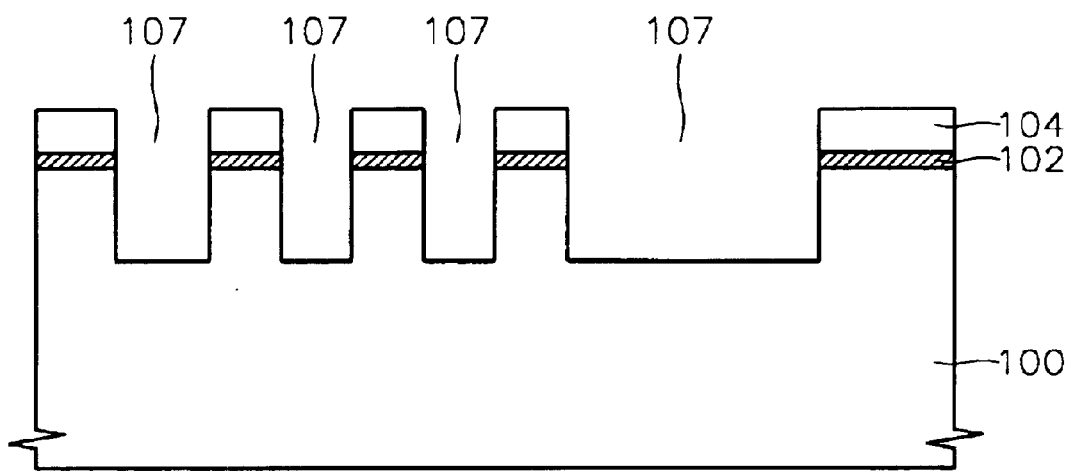
Figure 12:
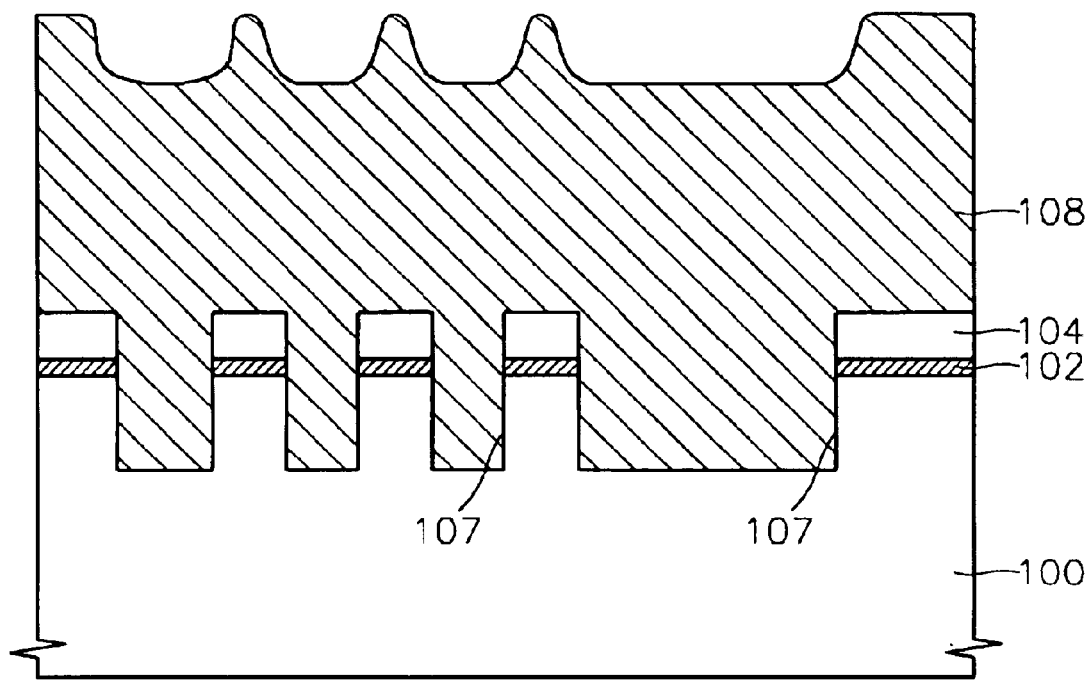

In this experiment, sample wafers, each comprising a total of 39 chips, were prepared through a STI process for 0.12-μm-level DRAMs. Referring to FIG. 10, a pad oxide layer 102 and a silicon nitride layer 104 were sequentially deposited over a wafer 100. The silicon nitride layer 104 was deposited to a thickness of 550 Å by LPCVD at a pressure of hundreds of mTorr or less or by PECVD at a high temperature in the range of about 500 to about 600 degrees C., using dichlorosilane and ammonia (NH3) as reactant gases. After forming a photoresist pattern 106 to define a trench region, the silicon nitride layer 104 was etched using the photoresist pattern 106 as an etch mask to form a silicon nitride layer pattern 104, which acts as a hard mask and a polishing stopper. Next, as shown in FIG. 11, the photoresist pattern 106 was removed, and the pad oxide layer 102 and the wafer 100 were partially etched using the silicon nitride layer pattern 104 as an etch mask, thereby forming a plurality of shallow trenches 107. Next, as shown in FIG. 12, an oxide layer 108 was deposited to a thickness of 5500 Å to fill the trenches 107 and cover the surface of the silicon nitride layer pattern 104. Here, the oxide layer 108 was formed of a PE-TEOS layer using PECVD.

A high selectivity slurry according to the present invention was prepared by adding 0.05 wt % AHP, 0.05 wt % PMA, and 0.05 wt % PHP to an aqueous solution of 1 wt % ceria, followed by a pH-adjustment to 5.

Figure 13:
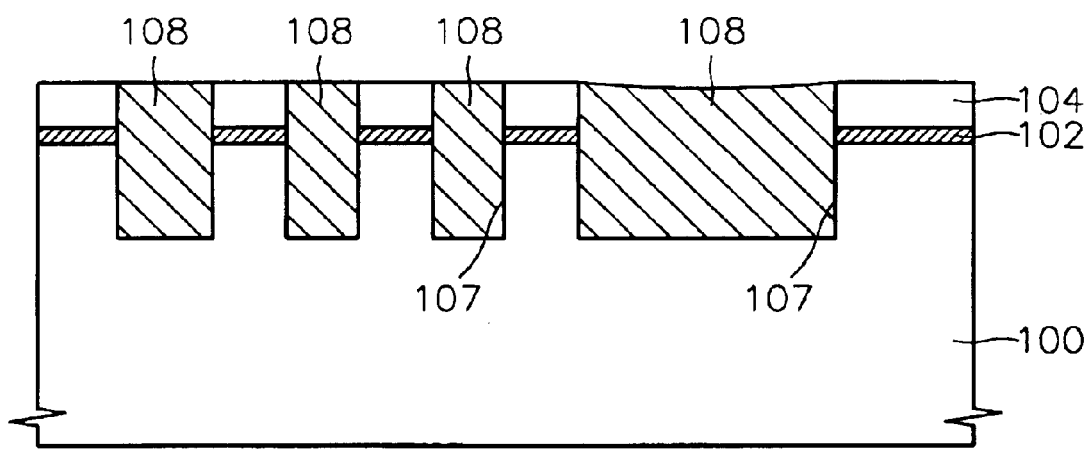
FIG. 13 is a sectional view of the sample wafer after CMP using a slurry according to the present invention.

CMP was performed on the sample wafers using the slurry, and a silicon nitride layer pattern 104 on the sample wafer was used as a polishing stopper. CMP was performed using 6ED equipment (Strasbaugh Co. Ltd.) using an IC1000 upper pad and Suba4 sub-pad. The final structure obtained is depicted in FIG. 13.

With respect to the resulting structure, a residual thickness of the silicon nitride layer pattern 104 as the polishing stopper was measured. The average of the residual thicknesses and its deviation were calculated, and a dishing depth in a 100 μm×100 μm area was measured. The results are shown in Table 7 below.

TABLE 7

| Sample wafer No. | CMP condition (down pressure-platen speed) | Thickness deviation of remaining nitride layer pattern, Å | Average thickness of remaining nitride layer pattern, Å | Dishing depth, Å |
|---|---|---|---|---|
| 1 | 3 psi - 93 rpm | 53 | 512 | 233 |
| 2 | 3.3 psi - 93 rpm | 55 | 502 | 278 |
| 3 | 3.5 psi - 103 rpm | 59 | 510 | 261 |
| 4 | 3.5 psi - 110 rpm | 54 | 505 | 250 |

As can be gleaned from Table 7, when a slurry according to the invention was applied, the nitride polishing stopper was removed by 30–50 Å. Also, the thickness deviation of the remaining nitride layer was as low as 50–60 Å. Evidently, a slurry according to the present invention provides high oxide to nitride oxide selectivity. As is apparent from Table 7, a slurry according to the invention can reduce a dishing phenomenon depending on the CMP conditions.

EXPERIMENTAL EXAMPLE 8

In this experiment, the oxide (PE-TEOS) removal rate was measured using slurries having different oxide to nitride selectivities. Sample wafer fabrication and CMP were performed as in Experimental Example 7, and the oxide (PE-TEOS) removal rate was measured. The results are shown in Table 8 and FIG. 14.

TABLE 8

| Selectivity | Oxide removal rate, Å/min |
|---|---|
| 12:1 | 3030 |
| 19:1 | 3237 |
| 20:1 | 3327 |
| 26:1 | 2784 |
| 33:1 | 1200 |
| 36:1 | 1233 |
| 40:1 | 1080 |
| 45:1 | 1347 |
| 50:1 | 1396 |
| 79:1 | 1880 |
| 104:1 | 1822 |
| 108:1 | 1911 |

Figure 14:
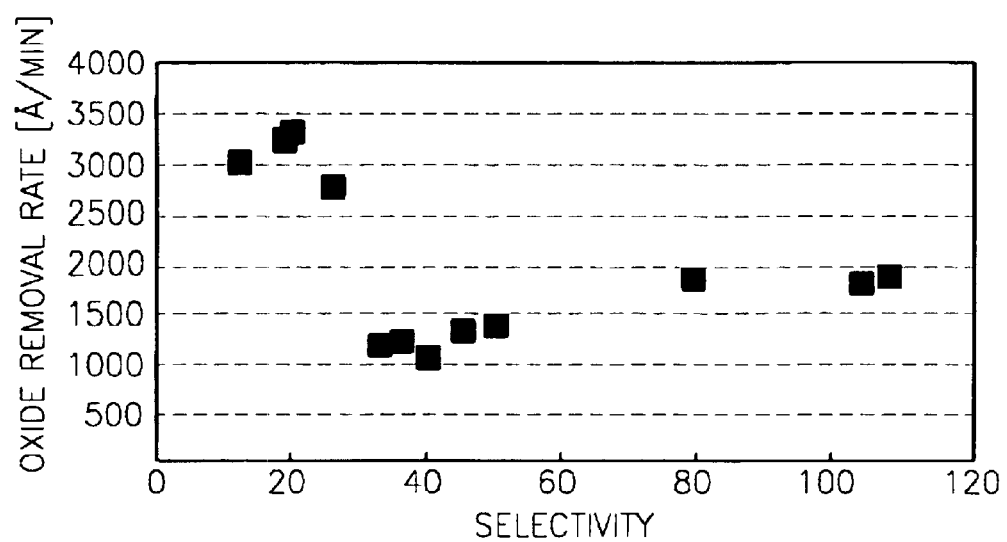
FIG. 14 is a graph of oxide removal rate as a function of CMP slurry selectivity.

As can be gleaned from Table 8 and FIG. 14, when the slurry had a selectivity in the range of about 30:1 to about 50:1, the oxide removal rate was in the range of about 1000 to about 1500 Å/min. In consideration of both nitride removal rate (the results in FIG. 7) and oxide removal rate to reduce the dishing phenomenon, a preferred oxide removal rate is in a range of about 1000 to about 1500 Å/min. Accordingly, it is preferably to use a slurry according to the present invention having a selectivity in the range of about 30:1 to about 50:1 to reduce the dishing phenomenon.

As described above, when a high selectivity slurry according to the present invention is used, a thickness variation of the polishing stopper is very small, and the wafer surface is very even without a dishing phenomenon. Accordingly, a margin for subsequent processes is increased. In addition, the initial thicknesses of the polishing stopper and a layer to be polished can be reduced as compared to using conventional CMP slurries.

While the present invention has been particularly shown and described with reference to preferred embodiments thereof, it will be understood by those of ordinary skill in the art that various changes in form and details may be made therein without departing from the spirit and scope of the present invention as defined by the appended claims.

What is claimed is:

1. A CMP (chemical/mechanical polishing) method, comprising the steps of:
   loading a wafer into a chemical/mechanical polishing apparatus, the wafer comprising a polishing stopper and a target layer to be polished deposited thereon; and
   performing CMP on the target layer on the wafer while supplying a CMP slurry between the surface of the target layer and a polishing pad,
   wherein the CMP slurry comprises metal oxide abrasive particles, a removal rate accelerator, an anionic polymeric passivation agent having a molecular weight in a range of about 1,000 to about 100,000, a C1–C12 anionic passivation agent, and water,
   wherein the anionic polymeric passivation agent comprises one of poly(acrylic acid), poly(methacrylic acid), poly(acrylic acid-maleic acid), poly(methacrylic acid-maleic acid), poly(acrylic acid-acrylamide), poly(acrylonitrile-butadien-acrylic acid), poly(acrylonitrile-butadien-methacrylic acid), a derivative or salt of any of the foregoing, and any combination thereof.

2. The method of claim 1, wherein the metal oxide abrasive particles comprise one of ceria, silica, alumina, titania, zirconia, germania, and any combination thereof.

3. The method of claim 1, wherein an amount of the metal oxide abrasive particles is in a range of about 0.5% to about 25% by weight based on the total weight of the slurry.

4. The method of claim 1, wherein the removal rate accelerator comprises one of a phosphate compound and a phosphite compound.

5. The method of claim 4, wherein the phosphate compound comprises one of ammonium hydrogen phosphate, ammonium dihydrogen phosphate, potassium dihydrogen phosphate, bis(2-ethylhexyl)phosphate, 2-aminoethyl dihydrogen phosphate, 4-chlorobenzene diazonium hexafluorophosphate, nitrobenzene diazonium hexafluorophosphate, ammonium hexafluorophosphate, bis(2,4dichlorophenyl)chlorophosphate, bis(2-ethylhexyl) hydrogenphosphate, calcium fluorophosphates, diethyl chlorophosphate, diethyl chlorothiophosphate, potassium hexafluorophosphate, pyrophosphate, tetrabutylammonium hexafluorophosphate tetraethylammonium hexafluorophosphate, and any combination thereof.

6. The method of claim 4, wherein the phosphite compound comprises bis(2-ethylhexyl)phosphite.

7. The method of claim 1, wherein an amount of the removal rate accelerator is in a range of about 0.001% to about 10% by weight based on the total weight of the slurry.

8. The method of claim 1, wherein an amount of the removal rate accelerator is in a range of about 0.01% to about 1% by weight based on the total weight of the slurry.

9. The method of claim 1, wherein an amount of the anionic polymeric passivation agent is in a range of about 0.001% to about 10% by weight based on the total weight of the slurry.

10. The method of claim 1, wherein an amount of the anionic polymeric passivation agent is in a range of about 0.01% to about 1% by weight based on the total weight of the slurry.

11. The method of claim 1, wherein the C1–C12 anionic passivation agent comprises phthalate.

12. The method of claim 11, wherein the phthalate comprises potassium hydrogen phthalate.

13. The method of claim 1, wherein an amount of the C1–C12 anionic passivation agent is in a range of about 0.001% to about 10% by weight based on the total weight of the slurry.

14. The method of claim 1, wherein an amount of the C1–C12 anionic passivation agent is in a range of about 0.01% to about 1% by weight based on the total weight of the slurry.

15. The method of claim 1, wherein the slurry further comprises a pH controller.

16. The method of claim 15, wherein the pH controller comprises one of:
   a base comprising potassium hydroxide, ammonium hydroxide, sodium hydroxide, tetramethylammonium hydroxide, or choline; and
   an acid comprising sulfuric acid, hydrochloric acid, phosphoric acid, nitric acid, or acetic acid.

17. The method of claim 1, wherein the slurry has a pH in a range of about 3 to about 6.

18. The method of claim 1, wherein the target layer to be polished comprises an insulating layer filling a trench in the wafer or an interlayer dielectric layer formed on the wafer having underlying structures.

19. The method of claim 1, wherein the target layer to be polished comprises an oxide layer, and the polishing stopper comprises a silicon nitride layer.

20. The method of claim 19, wherein the oxide layer comprise a HDPCVD or a PECVD oxide layer, and th silicon nitride layer comprises a LDCVD or a high-temperature PECVD silicon nitride layer.

21. The method of claim 1, wherein the slurry provides a selectivity of the target layer to the polishing stopper in a range of about 30:1 to about 50:1.

22. A slurry for use in chemical/mechanical polishing a wafer, the slurry comprising:
   metal oxide abrasive particles;
   a removal rate accelerator;
   an anionic polymeric passivation agent having a molecular weight in a range of about 1,000 to about 100,000, wherein the anionic polymeric passivation agent comprises one of poly(acrylic acid), poly(methacrylic acid), poly(acrylic acid-maleic acid), poly(methacrylic acid-maleic acid), poly(acrylic acid-acrylamide), poly(acrylonitrile-butadien-acrylic acid), poly(acrylonitrile-butadien-methacrylic acid), a derivative or a salt of any of the forgoing materials, and any combination thereof,
   a C1–C12 anionic passivation agent; and
   water.

23. The slurry of claim 22, wherein the metal oxide abrasive particles comprise one of ceria, silica, alumina, titania, zirconia, germania, and any combination thereof.

24. The slurry of claim 22, wherein an amount of the metal oxide abrasive particles is in a range of about 0.5% to about 25% by weight based on the total weight of the slurry.

25. The slurry of claim 22, wherein the removal rate accelerator comprises one of a phosphate compound and a phosphite compound.

26. The slurry of claim 25, wherein the phosphate compound comprises one of ammonium hydrogen phosphate, ammonium dihydrogen phosphate, potassium dihydrogen phosphate, bis(2-ethylhexyl)phosphate, 2-aminoethyl dihydrogen phosphate, 4-chlorobenzene diazonium hexafluorophosphate, nitrobenzene diazonium hexafluorophosphate, ammonium hexafluorophosphate, bis(2,4dichlorophenyl)chlorophosphate bis(2-ethylhexyl)

hydrogenphosphate calcium fluorophosphates, diethyl chlorophosphate, diethyl chlorothiophosphate, potassium hexafluorophosphate, pyrophosphate, tetrabutylammonium hexafluorophosphate, tetraethylammonium hexafluorophosphate, and any combination thereof.

27. The slurry of claim 25, wherein the phosphite compound comprises bis(2-ethylhexyl)phosphite.

28. The slurry of claim 22, wherein an amount of the removal rate accelerator is in a range of about 0.00 1% to about 10% by weight based on the total weight of the slurry.

29. The slurry of claim 22, wherein an amount of the removal rate accelerator is in a range of about 0.01% to about 1% by weight based on the total weight of the slurry.

30. The slurry of claim 22, wherein an amount of the anionic polymeric passivation agent is in a range of about 0.001% to about 10% by weight based on the total weight of the slurry.

31. The slurry of claim 22, wherein an amount of the anionic polymeric passivation agent is in a range of about 0.01% to about 1% by weight based on the total weight of the slurry.

32. The slurry of claim 22, wherein the C1–C12 anionic passivation agent comprises phthalate.

33. The slurry of claim 32, wherein the phthalate comprises potassium hydrogen phthalate.

34. The slurry of claim 22, wherein an amount of the C1–C12 anionic passivation agent is in a range of about 0.001% to about 10% by weight based on the total weight of the slurry.

35. The slurry of claim 22, wherein an amount of the C1–C12 anionic passivation agent is in a range of about 0.01% to about 1% by weight based on the total weight of the slurry.

36. The slurry of claim 22, further comprising a pH controller.

37. The slurry of claim 36, wherein the pH controller comprises one of:

a base comprising potassium hydroxide, ammonium hydroxide, sodium hydroxide, tetramethylammonium hydroxide, or choline; and an acid comprising sulfuric acid, hydrochloric acid, phosphoric acid, nitric acid, or acetic acid.

38. The slurry of claim 22, wherein the slurry has a pH in a range of about 3 to about 6.

39. The slurry of claim 22, wherein the slurry provides a selectivity of a target layer to a polishing stopper in a range of about 30:1 to about 50:1.

* * * * *